(12) United States Patent
Kim et al.

(10) Patent No.: US 9,035,288 B2
(45) Date of Patent: May 19, 2015

(54) ORGANIC LIGHT EMITTING DIODE AND ORGANIC LIGHT EMITTING DISPLAY

(71) Applicants: Dong-Chan Kim, Yongin (KR); Jong-Hyuk Lee, Yongin (KR); Young-Woo Song, Yongin (KR); Won-Jong Kim, Yongin (KR); Kyu-Hwan Hwang, Yongin (KR); Seok-Gyu Yoon, Yongin (KR); Eung-Do Kim, Yongin (KR); Bo-Ra Jung, Yongin (KR); Dong-Kyu Seo, Yongin (KR)

(72) Inventors: Dong-Chan Kim, Yongin (KR); Jong-Hyuk Lee, Yongin (KR); Young-Woo Song, Yongin (KR); Won-Jong Kim, Yongin (KR); Kyu-Hwan Hwang, Yongin (KR); Seok-Gyu Yoon, Yongin (KR); Eung-Do Kim, Yongin (KR); Bo-Ra Jung, Yongin (KR); Dong-Kyu Seo, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 13/900,845

(22) Filed: May 23, 2013

(65) Prior Publication Data

US 2014/0138639 A1    May 22, 2014

(30) Foreign Application Priority Data

Nov. 20, 2012  (KR) .................. 10-2012-0131878

(51) Int. Cl.
 *H01L 51/52*  (2006.01)
(52) U.S. Cl.
 CPC ..... *H01L 51/5218* (2013.01); *H01L 2251/5315* (2013.01)
(58) Field of Classification Search
 USPC .......................................... 257/40
 See application file for complete search history.

(56) References Cited

U.S. PATENT DOCUMENTS

2011/0050733 A1* 3/2011 Yano et al. .................. 345/690
2011/0241000 A1* 10/2011 Choi et al. ..................... 257/59
2012/0012838 A1* 1/2012 Hosono et al. ................ 257/43

FOREIGN PATENT DOCUMENTS

| KR | 10-0646974 B1 | 11/2006 |
| KR | 10-2009-0081347 A | 7/2009 |
| KR | 10-2010-0028797 A | 3/2010 |
| KR | 10-2012-0106192 A | 9/2012 |

* cited by examiner

*Primary Examiner* — Selim Ahmed
(74) *Attorney, Agent, or Firm* — Lee & Morse, P.C.

(57) ABSTRACT

An organic light emitting diode includes a first electrode including a reflective metal layer of a light-reflective metal, an upper transparent conductive layer on the reflective metal layer, and an amorphous oxide layer on the upper transparent conductive layer, an organic emission layer on the first electrode, and a second electrode on the organic emission layer.

19 Claims, 4 Drawing Sheets

ORGANIC LIGHT EMITTING DIODE AND ORGANIC LIGHT EMITTING DISPLAY

RELATED APPLICATIONS

This application claims priority under 35 U.S.C. §119 to Korean Patent Application No. 10-2012-0131878 filed in the Korean Intellectual Property Office on Nov. 20, 2012, the entire contents of which are incorporated herein by reference.

BACKGROUND

1. Field

Embodiments relate generally to an organic light emitting diode and an organic light emitting diode display. More particularly, embodiments relate generally to an organic light emitting diode having an organic emission layer positioned between two electrodes and an organic light emitting diode display.

2. Description of the Related Art

A display device is a device that displays an image. Recently, an organic light emitting diode display has been drawing attention.

A conventional organic light emitting diode display includes an organic light emitting diode for displaying an image by emitting light. The organic light emitting diode includes a first electrode, an organic emission layer, and a second electrode which are sequentially stacked.

SUMMARY

Embodiments are directed to an organic light emitting diode including a first electrode including a reflective metal layer of a light-reflective metal, an upper transparent conductive layer on the reflective metal layer, and an amorphous oxide layer on the upper transparent conductive layer, an organic emission layer on the first electrode, and a second electrode on the organic emission layer.

The reflective metal layer may contain silver (Ag).

The upper transparent conductive layer may contain indium tin oxide (ITO) or indium zinc oxide (IZO)

The organic light emitting diode may further include a lower transparent conductive layer facing the upper transparent conductive layer, with the reflective metal layer interposed therebetween.

The amorphous oxide layer may have a lower work function than the upper transparent conductive layer.

The amorphous oxide layer may have a smaller thickness than the upper transparent conductive layer.

The amorphous oxide layer may have a thickness of 1 nm to 5 nm.

The amorphous oxide layer may contain one or more of silver (Ag), copper (Cu), aluminum (Al), hydrogen fluoride (HF), rhenium (Re), tantalum (Ta), bismuth (Bi), iron (Fe), indium (In), ruthenium (Ru), tellurium (Te), vanadium (V), zirconium (Zr), chromium (Cr), gallium (Ga), antimony (Sb), and manganese (Mn).

The second electrode may be light-transmissive.

The reflective metal layer and the amorphous oxide layer may be in contact with the upper transparent conductive layer. The upper transparent conductive layer is amorphous.

The amorphous oxide layer may be formed at a temperature below 100° C.

An organic light emitting diode display may include a substrate, a wiring part positioned on the substrate, and the organic light emitting diode as described herein positioned on the wiring part and connected to the wiring part.

DETAILED DESCRIPTION

Figure 1:
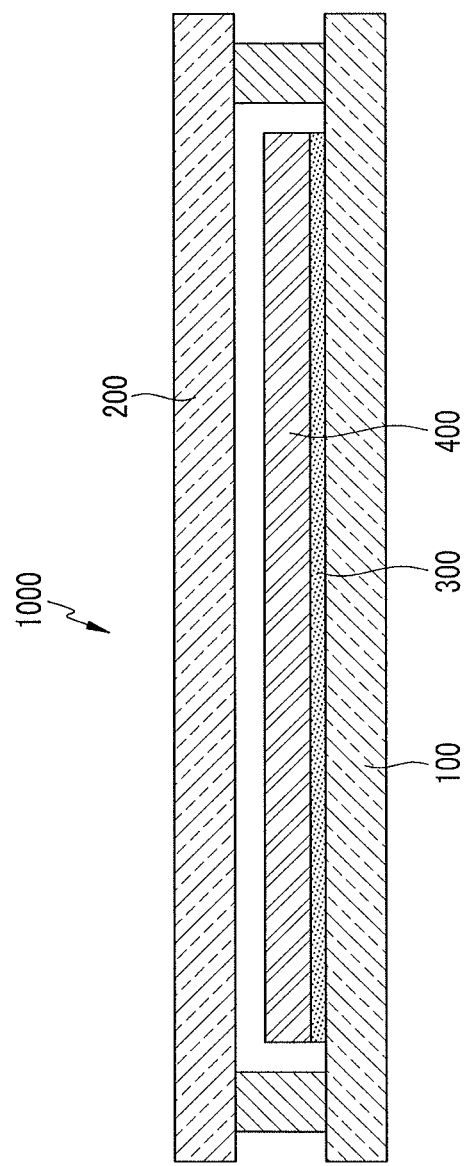
FIG. 1 is a cross-sectional view showing an organic light emitting diode display according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

To clarify the description of the present invention, parts not related to the description are omitted, and the same reference numbers will be used throughout the specification to refer to the same or like parts.

Further, the size and thickness of each of the elements shown in the drawings are arbitrarily shown for better understanding and ease of description, and the present invention is not limited thereto.

In the drawings, the thickness of some layers and areas are exaggerated for clarity. The thickness of the layers and areas are exaggerated in the drawings for better understanding and ease of description. It will be understood that when an element such as a layer, film, area, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, "on" implies being positioned above or below a target element and does not imply being necessarily positioned on the top on the basis of a gravity direction.

Hereinafter, an organic light emitting diode display according to an exemplary embodiment will be described with reference to FIGS. 1 to 4.

FIG. 1 is a cross-sectional view showing an organic light emitting diode display according to an exemplary embodiment.

As shown in FIG. 1, an organic light emitting diode display 1000 according to an exemplary embodiment includes a first substrate 100, a second substrate 200, a wiring part 300, and an organic light emitting diode 400.

The first substrate 100 and the second substrate 200 are insulating substrates including glass, polymer, stainless steel, or the like, and the second substrate 200 is made of a light transmissive material.

The wiring part 300 and the organic light emitting diode 400 are positioned on the first substrate 100, and the second substrate 200 faces the first substrate 100 with the wiring part 300 and the organic light emitting diode 400 interposed therebetween. The first substrate 100 and the second substrate 200 are attached and sealed to each other by a sealant with the organic light emitting diode 400 interposed therebetween.

The first substrate 100 and the second substrate 200 protect the wiring part 300 and the organic light emitting diode 400 from external interference.

While the organic light emitting diode display 1000 according to an exemplary embodiment includes the second substrate 200, an organic light emitting diode display according to another exemplary embodiment may be configured such that an encapsulation part may cover the first substrate 100 with the wiring part 300 and the organic light emitting diode 400 interposed therebetween.

The wiring part 300 includes switching and driving thin film transistors 10 and 20 (shown in FIG. 2) and drives the organic light emitting diode 400 by transferring a signal to the organic light emitting diode 400. The organic light emitting diode 400 emits light depending on the signal received from the wiring part 300.

The organic light emitting diode 400 is positioned on the wiring part 300. The organic light emitting diode 400 is positioned in a display area between the first substrate 100 and the second substrate 200, and receives the signal from the wiring part 300 so as to display an image by emitting light by the transferred signal.

Hereinafter, the internal structure of the organic light emitting diode display according to the exemplary embodiment will be described in detail with reference to FIGS. 2 to 4.

Figure 2:
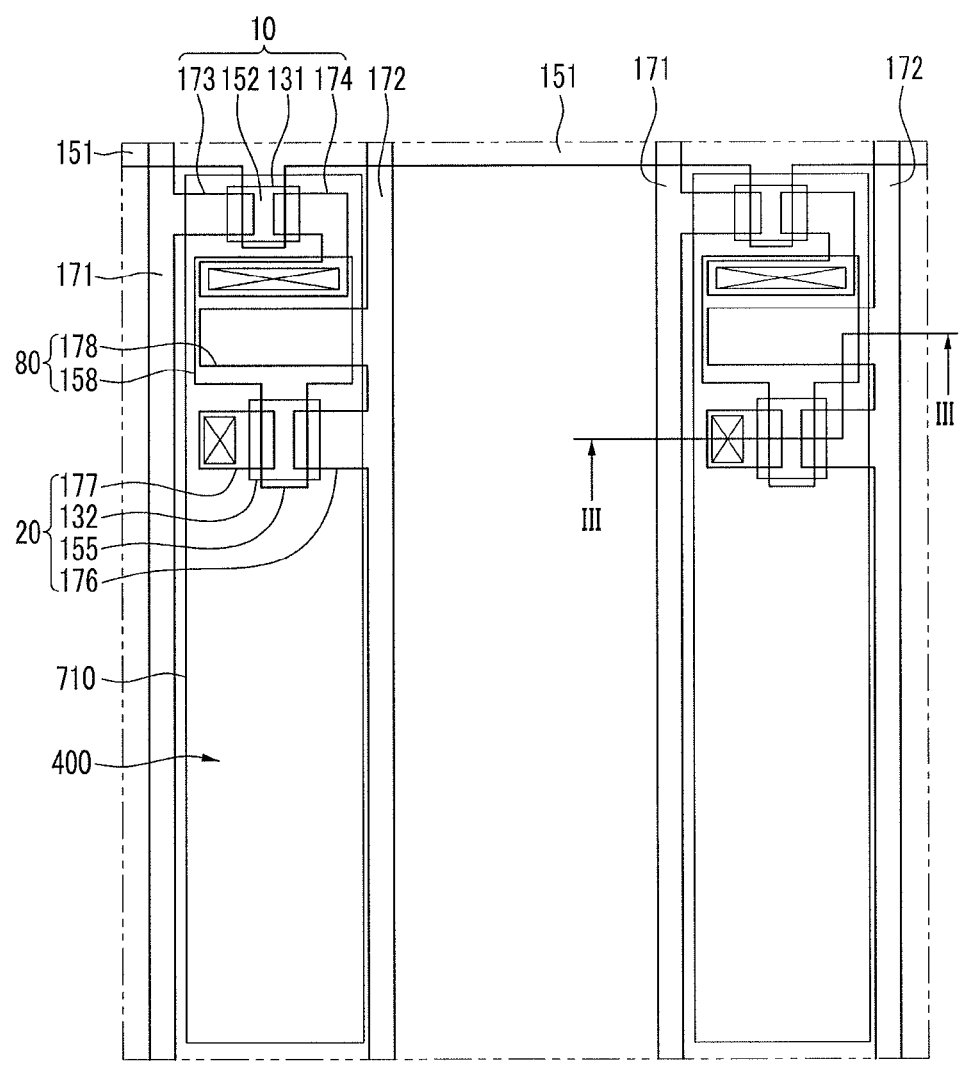
FIG. 2 is a layout view illustrating the structure of a pixel of the organic light emitting diode display according to the exemplary embodiment.

FIG. 2 is a layout view illustrating the structure of a pixel of the organic light emitting diode display according to the exemplary embodiment. FIG. 3 is a cross-sectional view taken along line III-III of FIG. 2.

Figure 3:
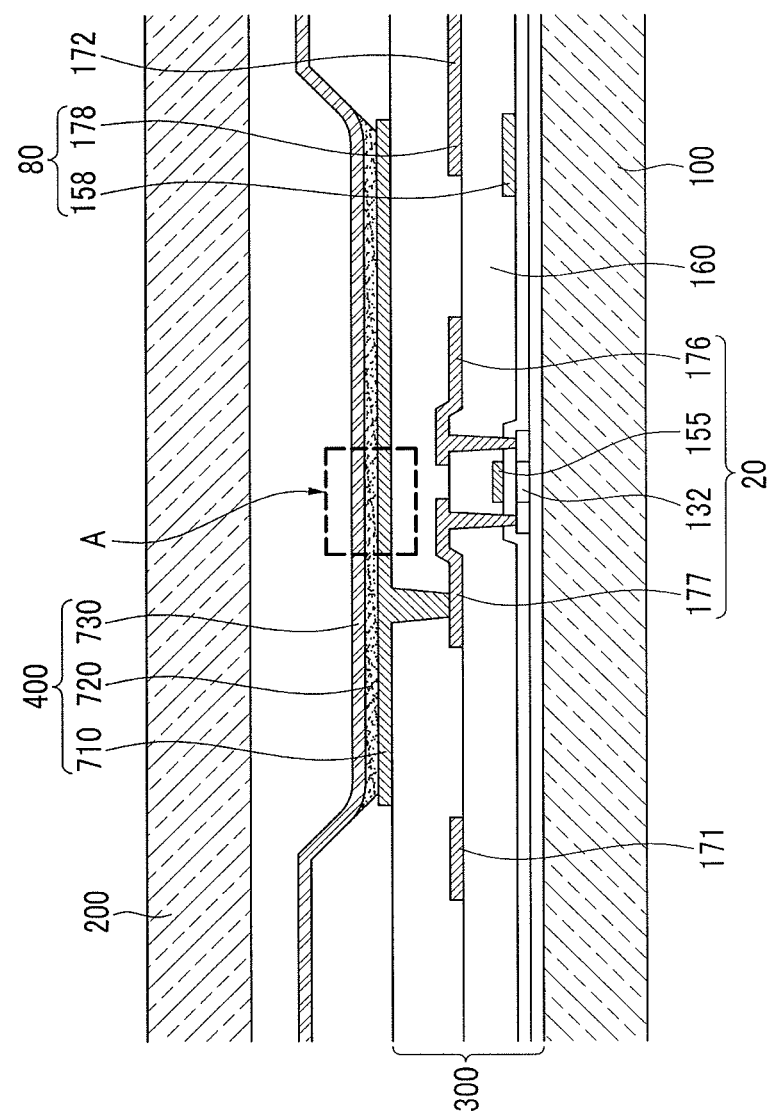
FIG. 3 is a cross-sectional view taken along line III-III of FIG. 2.

The detailed structures of the wiring part 300 and the organic light emitting diode 400 are shown in FIGS. 2 and 3, but the exemplary embodiment are not limited to the structures shown in FIGS. 2 and 3. The wiring part 300 and the organic light emitting diode 400 may be formed in various structures within the scope in which those skilled in the art can easily change. For example, in the accompanying drawings, although the organic light emitting diode display is shown as an active matrix (AM) type organic light emitting diode display having a 2Tr-1Cap structure, which is provided with two thin film transistors (TFTs) and one storage capacitor in one pixel, the present invention is not limited thereto. Therefore, in the case of the organic light emitting diode display, the number of thin film transistors, the number of storage capacitors, and the number of wires are not limited. The pixel represents the minimum unit displaying an image, and the organic light emitting diode display displays the image through a plurality of pixels.

As shown in FIGS. 2 and 3, the organic light emitting diode display includes a switching thin film transistor 10, a driving thin film transistor 20, a capacitor element 80, and an organic light emitting diode 400 which are formed in each pixel. Herein, a configuration including the switching thin film transistor 10, the driving thin film transistor 20, and the capacitor element 80 is referred to as the wiring part 300. In addition, the wiring part 300 further includes a gate line 151 disposed in one direction of the first substrate 100, and a data line 171 and a common power supply line 172 insulatively crossing the gate line 151. Herein, a boundary of one pixel may be defined by the gate line 151, the data line 171, and the common power supply line 172, but is not limited thereto.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

One or more of the switching semiconductor layer 131 and the driving semiconductor layer 132 may be made of polysilicon or oxide semiconductor. The oxide semiconductor may include at least one of Zn, Ga, Sn, and In-based oxides or compound oxides thereof, such as ZnO, InGaZnO4, Zn—In—O, or Zn—Sn—O. The switching semiconductor layer 131 and the driving semiconductor layer 132 each include a channel region not doped with a impurity and source and drain regions doped with an impurity on both sides of the channel region. These impurities vary depending on the type of thin film transistors, and may be N-type impurities or P-type impurities. If one or more of the switching semiconductor layer 131 and the driving semiconductor layer 132 is made of an oxide semiconductor, a protective layer may be added to one or more of the switching semiconductor 131 and the driving semiconductor layer 132 in order to protect the oxide semiconductor from the outside environment, such as exposure to high temperature.

The switching thin film transistor 10 is used as a switching element which selects a desired pixel to emit light. The switching gate electrode 152 is connected to the gate line 151. The switching source electrode 173 is connected to the data line 171. The switching drain electrode 174 is spaced apart from the switching source electrode 173 and is connected to any one capacitor plate 158.

The driving thin film transistor 20 applies driving power for allowing the organic emission layer 720 of the organic light emitting diode 400 in the selected pixel to emit light to the first electrode 710. The driving gate electrode 155 is connected to the storage plate 158 which is connected to the switching drain electrode 174. Each of the driving source electrode 176 and the other storage plate 178 is connected to the common power supply line 172. The first electrode 710 of the organic light emitting diode 400 extends from the driving drain electrode 177, and the driving drain electrode 177 and the first electrode 710 are connected to each other.

The capacitor element 80 includes a pair of capacitor plates 158 and 178, and an interlayer insulating layer 160 is disposed between the capacitor plates 158 and 178. The interlayer insulating layer 160 may function as a dielectric, and the capacitance of the capacitor element 80 is determined by the charges stored in the capacitor element 80 and the voltage between the capacitor plates 158 and 178.

By this structure, the switching thin film transistor 10 is driven by a gate voltage applied to the gate line 151 so as to transmit the data voltage applied to the data line 171 to the driving thin film transistor 20. A voltage corresponding to the difference between the common voltage applied to the driving thin film transistor 20 from the common power line 172 and the data voltage transmitted from the switching thin film transistor 10 is stored at the capacitor element 80. A current corresponding to the voltage stored at the capacitor element 80 flows to the organic light emitting diode 400 through the driving thin film transistor 20 to cause the organic light emitting diode 400 to emit light.

The organic light emitting diode 400 includes a first electrode 710, a second electrode 730 facing the first electrode, and an organic emission layer 720 positioned between the first electrode 710 and the second electrode 730. The first electrode 710, the organic emission layer 720, and the second electrode 730 are sequentially stacked on the first substrate 100. The organic emission layer 720 is positioned on the first electrode 710, and the second electrode 730 is positioned on the organic emission layer 720.

Figure 4:
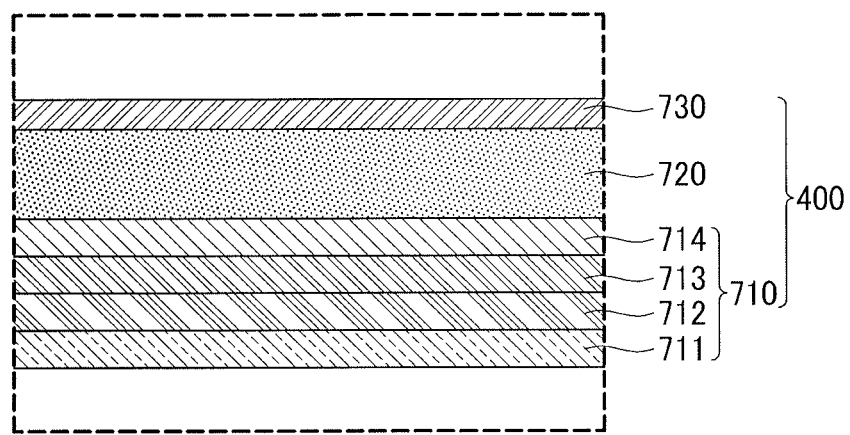
FIG. 4 is an enlarged view of part A of FIG. 3.

FIG. 4 is an enlarged view of part A of FIG. 3.

As shown in FIG. 4, the second electrode 730 is a light-transmissive cathode which acts as an electron injection electrode. The second electrode 730 includes a single layer or multiple layers of light-transmissive or light-semi-transmissive conductive material containing one or more of indium tin oxide (ITO), indium zinc oxide (IZO), magnesium silver (MgAg), aluminum (Al), and silver (Ag). The second electrode 730 may be made of a conductive material having a lower work function than the first electrode 710 to promote electron injection into the organic emission layer 720. The organic emission layer 720 is positioned below the second electrode 730.

The organic emission layer 720 may be made of a low-molecular organic material or a high-molecular organic material such as PEDOT (poly 3,4-ethylenedioxythiophene). The organic emission layer 720 may be formed as a multiple layer including one or more of an emission layer, a hole injection layer (HIL), a hole transporting layer (HTL), an electron transporting layer (ETL), and an electron injection layer (EIL). In the case where the organic emission layer 720 includes all of these layers, the hole injection layer is disposed on the first electrode 710, and then the hole transporting layer, the emission layer, the electron transporting layer, and the electron injection layer are sequentially stacked on the hole injection layer. The organic emission layer 720 may include a red organic emission layer for emitting red light, a green organic emission layer for emitting green light, and a blue organic emission layer 443 for emitting blue light. The red, green, and blue organic emission layers are formed in red, green, and blue pixels, respectively, to form a color image.

Moreover, all of the red, green, and blue organic emission layers of the organic emission layer 720 may be stacked in all of the red, green, and blue pixels, and a red color filter, a green color filter, and a blue color filter may be formed in the respective pixels to thereby display a color image. In another example, a white organic emission layer for emitting white light may be formed in all of the red, green, and blue pixels, and a red color filter, a green color filter, and a blue color filter may be formed in the respective pixels to thereby display a color image. When displaying a color image using the white organic emission layer and the color filters, there is no need to use a deposition mask to form red, green, and blue organic emission layers. This is advantageous for improving resolution.

The first electrode 710, which is an anode, is positioned below the organic emission layer 720. Holes and electrons are injected into the organic emission layer 720 from the first electrode 710 and the second electrode 730, respectively. When excitons formed by recombinations of the holes and electrons injected into the organic emission layer 720 drop from an excited state to a ground state, the organic emission layer 720 emits light.

The first electrode 710 is a light-reflective anode which acts as a hole injection electrode. As such, the organic light emitting diode 400 of the organic light emitting diode display 1000 according to an exemplary embodiment emits light in the direction of the second substrate 200. That is, the organic light emitting diode display 1000 according to an exemplary embodiment is a top-emission type.

The first electrode 710 includes a lower transparent conductive layer 711, a reflective metal layer 712, an upper transparent conductive layer 713, and an amorphous oxide layer 714 which are positioned above the first substrate 100.

The lower transparent conductive layer 711 includes indium tin oxide (ITO) or indium zinc oxide (IZO). The lower transparent conductive layer 711 faces the upper transparent conductive layer 713, with the reflective metal layer 712 interposed therebetween. The reflective metal layer 712 is positioned on the lower transparent conductive layer 711.

The reflective metal layer 712 may be formed of a light-reflective metal containing silver (Ag). Light emitted from the organic emission layer 720 is reflected by the reflective metal layer 712, passes through the upper transparent conductive layer 713 and the organic emission layer 720, and is transmitted through the second electrode 730. The reflective metal layer 712 serves to reflect the light emitted from the organic emission layer 720. The upper transparent conductive layer 713 is positioned on the reflective metal layer 712.

The upper transparent conductive layer 713 is made of a conductive material containing one or more of indium tin oxide (ITO) and indium zinc oxide (IZO) having a higher work function than the second electrode 730 to promote electron injection into the organic emission layer 720. The upper transparent conductive layer 713 serves to inject holes into the organic emission layer 720. The upper transparent conductive layer 713 is in contact with the reflective metal layer 712. The upper transparent conductive layer 713 is formed of a crystalline material, such that the upper transparent conductive layer 713 includes grain boundaries. An amorphous oxide layer 714 is positioned on the upper transparent conductive layer 713.

The amorphous oxide layer 714 is in contact with the upper transparent conductive layer 713, and is formed of a dense amorphous material having no grain boundaries. The amorphous oxide layer 714 is formed of an amorphous material, which is denser than the crystalline material and has no grain boundaries. Accordingly, it may be possible to prevent the silver contained in the reflective metal layer from binding to a gas such as sulfur (S) that could permeate from the outside through grain boundaries between crystals of the upper transparent conductive layer during the manufacturing process of the organic light emitting diode display 1000. That is, any external gas may be blocked by the amorphous oxide layer 714 having no grain boundaries. Accordingly, it may be possible to fundamentally prevent or reduce the occurrence of an external gas passing through the amorphous oxide layer 714 and permeating into the reflective metal layer 712 through the grain boundaries of the upper transparent conductive layer 713. As a result, one part of the reflective metal layer may be hindered or prevented from swelling, passing through the upper transparent conductive layer 713, and being short-circuited by the second electrode 730.

The amorphous oxide layer 714 includes a material having a lower work function than the upper transparent conductive layer 713. By including a material having a lower work function than the upper transparent conductive layer 713, the amorphous oxide layer 714 may help the injection of holes into the organic emission layer 720 from the upper transparent conductive layer 713.

The amorphous oxide layer 714 has a smaller thickness than the upper transparent conductive layer 713, for example, a thickness of substantially 1 nm to 5 nm. As the amorphous oxide layer 714 has a smaller thickness than the upper transparent conductive layer 713, the amorphous oxide layer 714 may help to minimize blocking of the holes injected from the upper transparent conductive layer 713 and to minimize the loss of light transmitted through the amorphous oxide layer 714 and emitted from the organic emission layer 720.

The amorphous oxide layer 714 may be formed by depositing one or more of silver (Ag), copper (Cu), aluminum (Al), hydrogen fluoride (HF), rhenium (Re), tantalum (Ta), bismuth (Bi), iron (Fe), indium (In), ruthenium (Ru), tellurium (Te), vanadium (V), zirconium (Zr), chromium (Cr), gallium (Ga), antimony (Sb), and manganese (Mn) on the upper transparent conductive layer 713 at a low temperature under 100° C. The amorphous oxide layer 714 includes an oxide containing one or more of silver (Ag), copper (Cu), aluminum (Al), hydrogen fluoride (HF), rhenium (Re), tantalum (Ta), bismuth (Bi), iron (Fe), indium (In), ruthenium (Ru), tellurium (Te), vanadium (V), zirconium (Zr), chromium (Cr), gallium (Ga), antimony (Sb), and manganese (Mn), which may provide a low potential barrier between the organic emission layer 720 and the upper transparent conductive layer 713.

As seen from above, in order for the first electrode 710 of the organic light emitting diode 400 to function as a light-reflective anode, the organic light emitting diode display 1000 according to an exemplary embodiment includes a reflective metal layer 712 formed of a metal and an upper transparent conductive layer 713, i.e., a crystalline oxide, formed of ITO or IZO, an amorphous oxide layer 714 which is positioned on the upper transparent conductive layer 713, is in contact with the upper transparent conductive layer 713, being formed of an amorphous material with no grain boundaries, and has a thickness less than 5 nm, which is smaller than the thickness of the upper transparent conductive layer 713, and has a low work function than the upper transparent conductive layer 713, all of these layers being sequentially stacked on a first substrate 100. This configuration may fundamentally prevent or hinder an external gas from passing through the amorphous oxide layer 714 and permeating into the reflective metal layer 712 through the grain boundaries of the upper transparent conductive layer 713, and may assist with the injection of holes into the organic emission layer 720 from the upper transparent conductive layer 713, may minimize blocking of the holes injected from the upper transparent conductive layer 713, and may minimize the loss of light transmitted through the amorphous oxide layer 714 and emitted from the organic emission layer 720.

That is, the organic light emitting diode display 1000 may have improved display quality and improved reliability.

By way of summation and review, recently, there has been developed a top-emission type organic light emitting diode display in which a first electrodes functions as a light reflective anode and light emitted from an organic emission layer is transmitted in the direction of a second electrode. The first electrode of the organic light emitting diode display includes a reflective metal layer including silver (Ag), which is a light reflective electrode, and a transparent conductive layer stacked on the reflective metal layer and including indium tin oxide (ITO) having a high work function.

However, during the manufacturing process of the organic light emitting diode display, the silver contained in the reflective metal layer may bind to a gas such as sulfur (S) permeating from the outside through grain boundaries between crystals of the transparent conductive layer. Thus, the above-described organic light emitting diode display is subject to the potential of one part of the reflective metal layer swelling and passing through the transparent conductive layer and hence becoming short-circuited with the second electrode.

In contrast, embodiments may provide an organic light emitting diode, and an organic light emitting diode display including the organic light emitting diode, with improved reliability.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode, comprising:
a first electrode including a reflective metal layer of a light-reflective metal, an upper transparent conductive layer on the reflective metal layer, and an amorphous oxide layer that is denser than the upper transparent conductive layer on the upper transparent conductive layer;
an organic emission layer on the first electrode; and
a second electrode on the organic emission layer.

2. The organic light emitting diode of claim 1, wherein the reflective metal layer contains silver (Ag).

3. The organic light emitting diode of claim 1, wherein the upper transparent conductive layer contains indium tin oxide (ITO) or indium zinc oxide (IZO).

4. The organic light emitting diode of claim 1, further comprising a lower transparent conductive layer facing the upper transparent conductive layer, with the reflective metal layer interposed therebetween.

5. The organic light emitting diode of claim 1, wherein the amorphous oxide layer has a lower work function than the upper transparent conductive layer.

6. The organic light emitting diode of claim 1, wherein the amorphous oxide layer has a smaller thickness than the upper transparent conductive layer.

7. The organic light emitting diode of claim 6, wherein the amorphous oxide layer has a thickness of 1 nm to 5 nm.

8. The organic light emitting diode of claim 1, wherein the amorphous oxide layer contains one or more of silver (Ag), copper (Cu), aluminum (Al), hydrogen fluoride (HF), rhenium (Re), tantalum (Ta), bismuth (Bi), iron (Fe), indium (In), ruthenium (Ru), tellurium (Te), vanadium (V), zirconium (Zr), chromium (Cr), gallium (Ga), antimony (Sb), and manganese (Mn).

9. The organic light emitting diode of claim 1, wherein the second electrode is light-transmissive.

10. The organic light emitting diode of claim 1, wherein the reflective metal layer and the amorphous oxide layer are in contact with the upper transparent conductive layer, and the upper transparent conductive layer is amorphous.

11. The organic light emitting diode of claim 1, wherein the amorphous oxide layer is formed at a temperature below 100° C.

12. An organic light emitting diode display comprising:
a substrate;
a wiring part positioned on the substrate; and
the organic light emitting diode of claim 1 positioned on the wiring part and connected to the wiring part.

13. An organic light emitting diode, comprising:
a first electrode including a reflective metal layer of a light-reflective metal, an upper transparent conductive layer on the reflective metal layer, and an amorphous oxide layer on the upper transparent conductive layer, the amorphous oxide layer having a lower work function than the upper transparent conductive layer;
an organic emission layer on the first electrode; and
a second electrode on the organic emission layer.

14. The organic light emitting diode of claim 13, wherein the amorphous oxide layer contains one or more of silver (Ag), copper (Cu), aluminum (Al), hydrogen fluoride (HF), rhenium (Re), tantalum (Ta), bismuth (Bi), iron (Fe), ruthenium (Ru), tellurium (Te), vanadium (V), zirconium (Zr), chromium (Cr), gallium (Ga), antimony (Sb), and manganese (Mn).

15. The organic light emitting diode of claim 13, wherein the amorphous oxide layer prevents external gas from permeating into the reflective metal layer.

16. The organic light emitting diode of claim 1, wherein the amorphous oxide layer contains one or more of silver (Ag), copper (Cu), aluminum (Al), hydrogen fluoride (HF), rhenium (Re), tantalum (Ta), bismuth (Bi), iron (Fe), ruthenium (Ru), tellurium (Te), vanadium (V), zirconium (Zr), chromium (Cr), gallium (Ga), antimony (Sb), and manganese (Mn).

17. The organic light emitting diode of claim 1, wherein the amorphous oxide layer prevents external gas from permeating into the reflective metal layer.

18. An organic light emitting diode, comprising:
- a first electrode including a reflective metal layer of a light-reflective metal, an upper transparent conductive layer on the reflective metal layer, and an amorphous oxide layer on the upper transparent conductive layer, the amorphous oxide layer containing one or more of silver (Ag), copper (Cu), aluminum (Al), hydrogen fluoride (HF), rhenium (Re), tantalum (Ta), bismuth (Bi), iron (Fe), ruthenium (Ru), tellurium (Te), vanadium (V), zirconium (Zr), chromium (Cr), gallium (Ga), antimony (Sb), and manganese (Mn);
- an organic emission layer on the first electrode; and
- a second electrode on the organic emission layer.

19. The organic light emitting diode of claim 18, wherein the amorphous oxide layer prevents external gas from permeating into the reflective metal layer.

\* \* \* \* \*

UNITED STATES PATENT AND TRADEMARK OFFICE
CERTIFICATE OF CORRECTION

PATENT NO.       : 9,035,288 B2                       Page 1 of 1
APPLICATION NO.  : 13/900845
DATED            : May 19, 2015
INVENTOR(S)      : Dong-Chan Kim et al.

It is certified that error appears in the above-identified patent and that said Letters Patent is hereby corrected as shown below:

Title Page, Item (54) should read:

--ORGANIC LIGHT EMITTING DIODE AND ORGANIC LIGHT EMITTING DIODE DISPLAY--

In the Specification:
Column 1, lines 1-2, the Title should read:

--ORGANIC LIGHT EMITTING DIODE AND ORGANIC LIGHT EMITTING DIODE DISPLAY--

Signed and Sealed this
Sixth Day of October, 2015

Michelle K. Lee
*Director of the United States Patent and Trademark Office*